United States Patent

Tao et al.

[11] Patent Number: 6,093,960
[45] Date of Patent: Jul. 25, 2000

[54] SEMICONDUCTOR PACKAGE HAVING A HEAT SPREADER CAPABLE OF PREVENTING BEING SOLDERED AND ENHANCING ADHESION AND ELECTRICAL PERFORMANCE

[75] Inventors: Su Tao, Kaohsiung; Kuang-Lin Lo, Kaohsiung Hsien; Hsin-Hsing Wei, Kaohsiung, all of Taiwan

[73] Assignee: Advanced Semiconductor Engineering, Inc., Kaohsiung, Taiwan

[21] Appl. No.: 09/330,036

[22] Filed: Jun. 11, 1999

[51] Int. Cl.[7] .................. H01L 23/48; H01L 29/44; H01L 23/28
[52] U.S. Cl. .................. 257/706; 257/666; 257/675; 257/712; 257/713; 257/717; 257/720; 257/796; 257/762; 257/766; 257/788; 257/790
[58] Field of Search .................. 257/706, 675, 257/712, 713, 717, 720, 796, 678, 666, 690, 693, 762, 766, 788, 790

[56] References Cited

U.S. PATENT DOCUMENTS

| 4,524,238 | 6/1985 | Butt ................................ 174/52.4 |
|---|---|---|
| 5,013,871 | 5/1991 | Mahulikar et al. .................. 174/52.4 |
| 5,343,073 | 8/1994 | Parthasarathi et al. .................. 257/666 |
| 5,367,196 | 11/1994 | Mahulikar et al. .................. 257/787 |
| 5,402,006 | 3/1995 | O'Donley .................. 257/796 |
| 5,449,951 | 9/1995 | Parthasarathi et al. .................. 257/677 |
| 5,596,231 | 1/1997 | Combs .................. 257/796 |
| 5,608,267 | 3/1997 | Mahulikar et al. .................. 257/796 |
| 5,650,663 | 7/1997 | Parthasarathi .................. 257/706 |
| 5,814,880 | 9/1998 | Costello et al. .................. 257/678 |

*Primary Examiner*—Alexander Oscar Williams
*Attorney, Agent, or Firm*—Bacon & Thomas

[57] ABSTRACT

A semiconductor package has a die and a plurality of leads electrically connected to the die with bonding wires. A heat spreader has an upper face thermally contacted with the die. The heat spreader is formed by a copper core having at least a portion of surface sequentially coated with a metal medium layer and an insulation layer, wherein the metal medium layer has an adhesion degree with insulation material higher than copper. A package body encapsulates the die, the heat spreader and the plurality of leads, wherein the surface area of the heat spreader that contacts with the package body is coated with the metal medium layer and the insulation layer.

3 Claims, 2 Drawing Sheets

SEMICONDUCTOR PACKAGE HAVING A HEAT SPREADER CAPABLE OF PREVENTING BEING SOLDERED AND ENHANCING ADHESION AND ELECTRICAL PERFORMANCE

BACKGROUND OF THE INVENTION

1. Field of the Invention

The present invention relates to the field of semiconductor packaging, and more particularly, to a semiconductor package having a heat spreader which has a metal medium layer and an insulation layer coated thereon.

2. Description of Related Art

Because the semiconductor device is getting complicated in function and miniaturized in dimension, the heat generated by the semiconductor device is thus increased. To maintain the semiconductor device operate in a normal temperature range, FIG. 4 shows a semiconductor package which has a metal spreader (91) to assist in dissipating excess heat. The metal spreader (91) is typically made of copper that has a relative high thermal coefficient. Such a copper heat spreader (91) contacts with a die pad (93) which has a die (92) mounted thereon so that the heat generated by the die (92) can be dissipated through the heat spreader (91). Further, resin is generally applied to form the package body (94) for encapsulating the die (92), die pad (93) and the heat spreader (91) thereby forming a semiconductor package wherein the bottom face of the heat spreader (91) is exposed.

The above semiconductor package is able to dissipate heat generated by the die (92) with the use of the heat spreader (91). However, because the adhesion degree between copper and resin is relative low, the adhesion between the heat spreader (91) and the package body (94) is weak. Therefore, a tiny gap is likely to exist between the heat spreader (91) and the package body (94) so that moisture or contaminants may enter into the semiconductor package and damage the circuit therein. Further, in the semiconductor packaging process, a ground bonding wire (96) is usually connected to the die pad (93) to improve ground effect for the die (92). As a result, when the external lead (95) of the semiconductor device is electroplated in an electrobath, the exposed bottom face of the heat spreader (91) may be soldered because an electrical conductive path is formed from the external lead (95), bonding wire (97), ground bonding wire (96), die pad (93) to the heat spreader (91). Such a soldering to the heat spreader (91) is undesired, and therefore, there is a need for the above semiconductor package to be improved.

SUMMARY OF THE INVENTION

The object of the present invention is to provide a semiconductor package having a heat spreader capable of preventing being soldered and enhancing adhesion and electrical performance.

To achieve the object, the semiconductor package in accordance with the present invention has a die and a plurality of leads electrically connected to the die with bonding wires. A heat spreader has an upper face thermally contacted with the die. The heat spreader is formed by a copper core having at least a portion of surface sequentially coated with a metal medium layer and an insulation layer, wherein the metal medium layer has an adhesion degree with insulation material higher than copper. A package body encapsulates the die, the heat spreader and the plurality of leads, wherein the surface area of the heat spreader that contacts with the package body is coated with the metal medium layer and the insulation layer.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
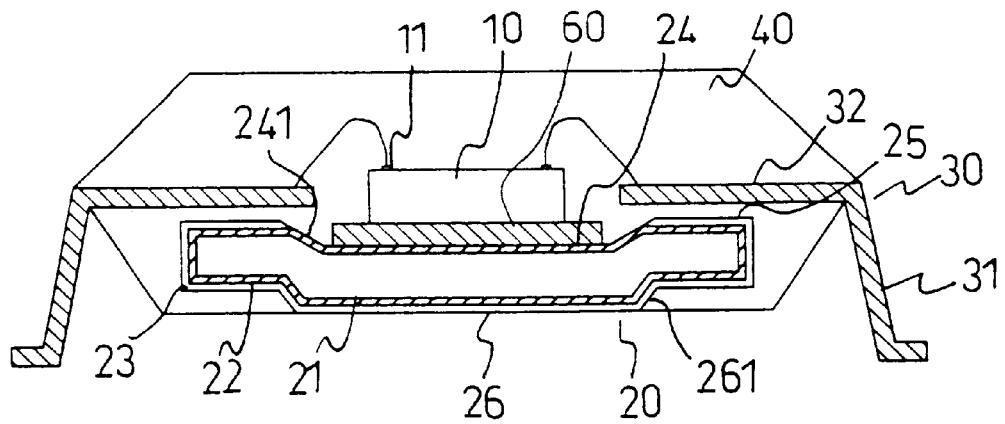
FIG. 1 is a side cross sectional view of a semiconductor package in accordance with the first preferred embodiment of the present invention.

FIG. 1 shows a semiconductor package in accordance with the first preferred embodiment of the present invention, which includes a die (10), a die pad (60) to support the die (10), a heat spreader (20) contacted with the die pad (60), a plurality of leads (30) electrically connected to the die (10), and a package body (40) formed by epoxy resin to encapsulate the die (10), die pad (60) and heat spreader (20). The die (10) has a plurality of solder pads (11), each being connected to a lead (30) via a bonding wire (50) thereby establishing electrical connection between the die (10) and the leads (30). In this preferred embodiment, the upper face (24) of the heat spreader (20) defines a recess portion (241) and the bottom face (26) thereof has an exposed protruded portion (261). The die pad (60) is disposed in the recess portion (241) of the heat spreader (20) so that the die (10) is thermally contacted with the heat spreader (20) and the heat generated by the die (10) can be conduct to the heat spreader (20) for being dissipated via the protruded portion (261) to outside. Further, a metal shielding effect is provided as the die pad (60) is disposed in the recess portion (241) of the heat spreader (20). In addition, the leads (10) are provided for signal inputs and outputs, each lead (10) having an internal lead (32), which is inside the package body (40), and an external lead (31), which is outside the package body (40).

The heat spreader (20) is a copper core (21) sequentially coated with a metal medium layer (22) and an insulation layer (23). The metal medium layer (22) is formed by metal material, such as chrome or chrome oxide, with a chromate conversion coating process. The chrome or chrome oxide is known to have an adhesion degree with insulation material higher than copper. The insulation layer (23) is formed by electrodeposit process to coat epoxy resin on all or part of the surface of the metal medium layer (22). Preferably, the insulation layer (23) is coated on the whole surface of the heat spreader (20) in addition to that of the recess portion (241). With such selected materials and surface processing, a secure adhesion between the heat spreader (20) and the package body (40) can be achieved. In details, the metal medium layer (22) and the copper core (21) are all of metal and can be securely bonded, and the chrome or the like of the metal medium layer (22) is easy to adhered to insulation material. Therefore, the insulation layer (23) can be securely adhered to the heat spreader (20) via the metal medium layer (22). Further, because the insulation layer (23) has high affinity with epoxy resin, the package body (40), that is formed by epoxy resin, can be securely adhered to the insulation layer (23). Accordingly, the adhesion between the heat spreader (20) and the package body (40) is so secure without forming any tiny gaps so that no moisture or contaminant is allowed to enter the package body (40) to damage the semiconductor device. Thus, the quality of the semiconductor package is highly increased. Moreover, because the heat spreader (20) is coated with the insulation layer (23) which is not electrically conductive, the exposed protruded portion (261) of the heat spreader (20) will not be soldered when an electroplate process is undertaken to the external leads (31). Therefore, the use of the heat spreader (20) does not cause any difficulties in manufacturing process for the semiconductor package. Further, the upper peripheral portion (25) of the heat spreader (20), that is under the inner lead (32), is coated with the insulation layer (23) so that it can be arranged to close to the inner lead (32) to have a better metal shielding effect. Besides, the recess portion (241) of the heat spreader (20) is not coated with the insulation layer (23) so that the heat spreader (20) and the die pad (60) are electrically conductive thereby improving the grounding effect for the semiconductor device.

Figure 2:
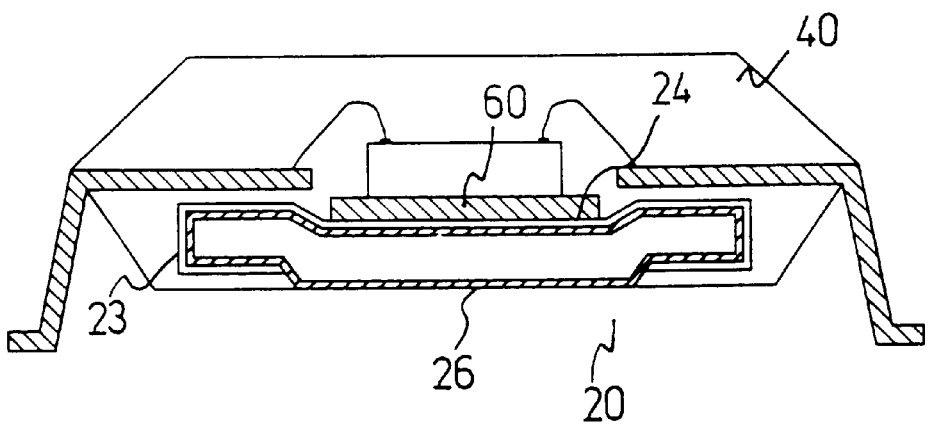
FIG. 2 is a side cross sectional view of a semiconductor package in accordance with the second preferred embodiment of the present invention.
Figure 3:
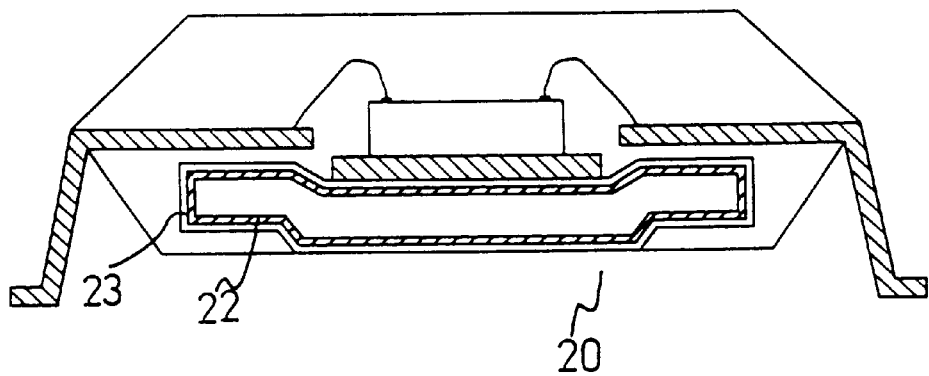
FIG. 3 is a side cross sectional view of a semiconductor package in accordance with the third preferred embodiment of the present invention.

FIG. 2 shows a semiconductor package in accordance with the second preferred embodiment of the present invention, which is identical to semiconductor package of FIG. 1 with the exception that the recess portion (241), that is contacted with the die pad (60), is also coated with the insulation layer (23).

Figure 4:
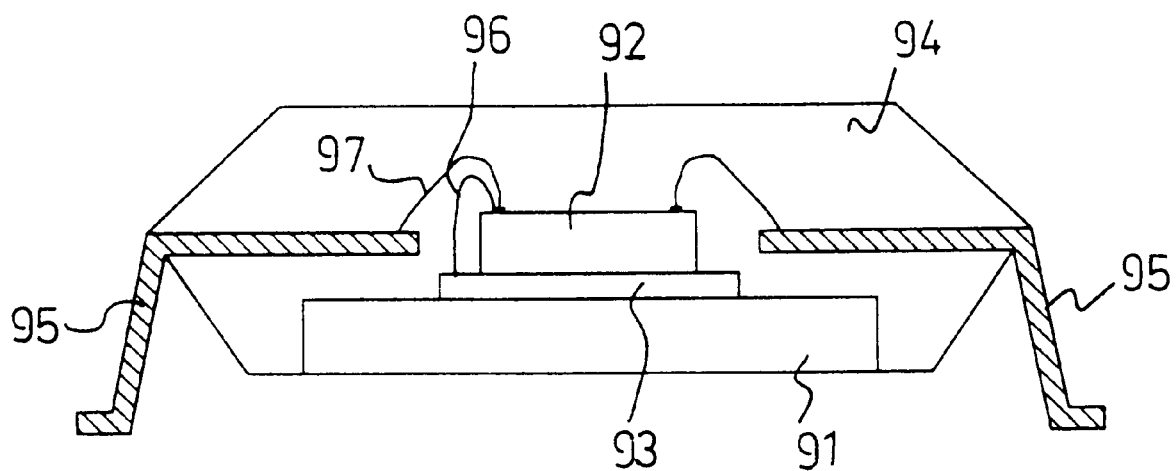
FIG. 4 is a side cross sectional view of a conventional semiconductor package.

FIG. 4 shows a semiconductor package in accordance with the third preferred embodiment of the present invention, which is identical to semiconductor package of FIG. 1 with the exception that the whole surface of the heat spreader (20) is coated with both of the metal medium layer (22) and the insulation layer (23).

Although the present invention has been explained in relation to its preferred embodiment, it is to be understood that many other possible modifications and variations can be made without departing from the spirit and scope of the invention as hereinafter claimed.

What is claimed is:

1. A semiconductor package, comprising:

a die (10);

a plurality of leads (30) electrically connected to said die (10) with bonding wires (50);

a heat spreader (20) having an upper face (24) thermally contacted with said die (10), said heat spreader (20) being formed by a copper core (21) having at least a portion of surface sequentially coated with a metal medium layer (22) and an insulation layer (23), wherein said metal medium layer (22) has an adhesion degree with insulation material higher than copper; and a package body (40) for encapsulating said die (10), said heat spreader (20) and said plurality of leads (30), wherein the surface area of said heat spreader (20) that contacts with said package body (40) is coated with said metal medium layer (22) and said insulation layer (23), said insulation layer (23) having an affinity to said package body (40); and a die pad (60) for supporting said die (10), said die pad (60) being in contact with said heat spreader (20) so that heat generated by said die (10) can be dissipated through said heat spreader (20);

wherein said heat spreader (20) has an upper face (24) with a recess portion (241) defined therein for supporting and contacting said die (10) and a bottom face (26) with a protruded portion (261) formed thereon exposed from said package body (40), and wherein said metal medium layer (22) and said insulation layer (23) are substantially coated on the whole surface of said copper core (21) except that said recess portion (241) is not coated with said insulation layer (23).

2. The semiconductor package as claimed in claim 1, wherein said metal medium layer (22) and said insulation layer (23) are substantially coated on the whole surface of said copper core (21) except that said protruded portion (261) is not coated with said insulation layer (23).

3. The semiconductor package as claimed in claim 1, wherein said metal medium layer (22) and said insulation layer (23) are coated on the whole surface of said copper core (21).

* * * * *